United States Patent [19]

Sasaki

[11] Patent Number: 5,352,277
[45] Date of Patent: Oct. 4, 1994

[54] FINAL POLISHING COMPOSITION

[75] Inventor: Shigeo Sasaki, Yokkaichi, Japan

[73] Assignee: E. I. Du Pont de Nemours & Company, Wilmington, Del.

[21] Appl. No.: 105,462

[22] Filed: Jul. 26, 1993

Related U.S. Application Data

[63] Continuation of Ser. No. 908,058, Jul. 6, 1992, abandoned, which is a continuation of Ser. No. 448,624, Dec. 11, 1989, abandoned.

[30] Foreign Application Priority Data

Dec. 12, 1988 [JP] Japan ................. 63-313480

[51] Int. Cl.$^5$ .................. C09G 1/02; C09G 1/16
[52] U.S. Cl. ........................ 106/6; 106/3; 106/5; 106/208; 106/209; 106/287.11; 106/287.13; 106/287.14; 106/287.34; 106/491; 51/298; 51/308; 51/309
[58] Field of Search ............. 106/3, 6, 287.11, 287.13, 106/287.14, 287.34, 5, 208, 209, 491; 51/298, 308, 309

[56] References Cited

U.S. PATENT DOCUMENTS

| | | | |
|---|---|---|---|
| 4,260,396 | 4/1981 | Glemza | 51/298 |
| 4,664,679 | 5/1987 | Kohyama et al. | 51/308 |
| 5,226,930 | 7/1993 | Sasaki | 51/308 |

Primary Examiner—Karl Group
Assistant Examiner—Scott L. Hertzog
Attorney, Agent, or Firm—Sherman and Shalloway

[57] ABSTRACT

A final polishing composition for polishing a silicon wafer used as a substrate crystal in electrical integrated circuits comprises water, colloidal silica, a water-soluble polymeric compound, and a water-soluble salt.

3 Claims, No Drawings

FINAL POLISHING COMPOSITION

This application is a continuation of application Ser. No. 07/908,058, filed Jul. 6, 1992, now abandoned, which is a continuation of application Ser. No. 07/448,624, filed Dec. 11, 1989, now abandoned.

BACKGROUND OF THE INVENTION

1. Field of the Invention

Wafers which are widely used as substrate crystals for electrical integrated circuits are typically produced by slicing a silicon or germanium crystal ingot, and the surface of these wafers is polished to form a flat surface having as little roughness as possible, which are then used for the formation of integrated circuits (IC). This is because, if there are irregularities on the surface of the wafer, precise and fine depiction of the circuit patterns will become difficult, and undesirable electrical characteristics of the IC will result.

Polishing of wafers, especially that of a silicon wafer, which is particularly of industrial importance because of its frequent use, is normally carried out in two steps, primary polishing and final polishing. The primary polishing is a polishing process to remove surface defects formed before the primary polishing process. Since these wafers, before the primary polishing, have defects of approximately 10 to 50 $\mu$m, an abrasive is often used to provide a high polishing speed. However, surface roughness of wafers obtained by the primary polishing process is generally 5 m$\mu$ to 500 m$\mu$, which is too rough to provide satisfactory performance as substrates for IC's.

Then, final polishing is required. In the final polishing process, wafer surfaces having 5 m$\mu$ to 100 m$\mu$ of roughness obtained in the primary polishing process are further finished to a surface of a level that no roughness is observed by means of a differential interference microscope.

This invention relates to a composition for smooth polishing of the surface of a wafer widely used as a substrate for IC's, more specifically, to a polishing composition used in the final polishing process for smooth polishing of the surface of a wafer to remove roughness greater than 5 m$\mu$ present on the wafer surface.

2. Description of Prior Art

Heretofore, to polish the surface of a wafer, there have been proposed a variety of polishing agents.

For example, the specification of U.S. Pat. No. 3,170,273 discloses a silica sol containing 2 to 50% by weight of silica and a silica gel containing 2 to 100% of silica as polishing agents. The specification of U.S. Pat. No. 3,328,141 discloses that when these polishing agents are mixed with an alkaline compound to adjust the pH value to 10.5 to 12.5, the resulting polishing agents have increased polishing speeds. However, observation by a differential interference microscope, for example, or the like of the surface of wafers polished using these polishing agents has revealed roughness of 5 to 500 m$\mu$ therefore, these polishing agents are not satisfactory.

Japanese Patent Publication No. 53-9910/1978 discloses a polishing agent containing quartz, silicates, and hexafluorosilicates, and further containing a monohydric alcohol having 3 to 5 carbon atoms, and polyvinyl alcohol. However, the polished surface obtained has not been satisfactory, and the polishing agents containing these alcohols have problems in that they are difficult to store for a long time.

Furthermore, a composition comprising water-soluble carboxymethylene rubber or xanthane gum is disclosed in Japanese Patent Publication 61-14655/1986 (U.S. Pat. No. 4,260,396). However, this composition is to be used in a primary polishing process, at a polishing pressure of 3.9 pounds per square inch ($=274$ gr/cm$^2$) and at a rate of 4.0 mils per hour ($=1.7$ microns per minute). When this composition is used at a low polishing pressure of about 100 g/cm$^2$ those conditions which are applied to secondary polishing, to obtain a surface of such level that no irregularities can be observed, it requires a long polishing time and a long rinse polishing time for rinsing in flowing water after polishing. Moreover, the purpose for containing water-soluble carboxymethylene rubber or xanthane gum is to prevent the sedimentation of silica hydrogel. However, sedimentation of silica tends to take place even in the presence of the rubbers or gum, thus stirring or shaking is required before it is used as a polishing agent.

The specification of U.S. Pat. No. 4,462,188 discloses a polishing agent containing an aqueous colloidal silica gel or sol, an amine, a water-soluble quaternary ammonium salt or base. However, as can be seen from the examples, this polishing agent is too high in polishing speed, and is thus obviously to be used for the primary polishing process.

Furthermore, the specification of U.S. Pat. No. 4,664,679 discloses a method to obtain an aqueous dispersion of silicic acid anhydride used as a polishing agent. However, as can be seen from the examples, the polishing agent obtained from this method results in a large surface roughness (R-max) of 0.1 $\mu$m, and is thus obviously to be used for the primary polishing process.

It is the primary object of the present invention to eliminate the difficulties of prior arts. Further, the objects are:

1. a polishing agent which gives a polished surface having no roughness detectable by a differential interference microscope,
2. a polishing agent which requires a short polishing time to obtain a smooth surface,
3. a polishing agent which requires a smaller amount of silica to obtain a smooth surface, and
4. a polishing agent which can be stably stored for a long time.

SUMMARY OF THE INVENTION

The inventors have conducted intensive studies to solve the above problems. As a result, the inventors have obtained findings that a composition comprising colloidal silica, a specific water-soluble polymeric compound, a specific water-soluble salt, and water for dilution and/or dissolution can solve the above problems.

In accordance with the present invention which attains the above object, there is provided a final polishing composition for a wafer comprising colloidal silica, a water-soluble salt, and water.

The present invention will now be described in detail. The colloidal silica useful for the present invention is referred to a stable colloidal dispersion of amorphous silica in a liquid. 15 In this liquid, average particle diameter of the silica particles preferably ranges from 5 to 500 m$\mu$, more preferably no greater than 100 m$\mu$. If the average particle size is less than 5 m$\mu$, ratios of silicic acid monomer and oligomer contained in the colloidal dispersion will become increased and, when the surface of a wafer is polished using such a polishing composition, silica tends to adhere to the surface of the wafer, which is undesirable. If the average particle diameter exceeds 500 mµ, the surface of the wafer tends to be scratched, which is also undesirable.

The average particle diameter used in the present invention: (1) when the particles are present separately with no agglomerations, means average diameter of these particles, (2) when the particles are agglomerated, means average diameter of such agglomerated particles.

The colloidal silica useful for the present invention preferably has silanol on the surface of the particles in a surface density of 1 to 10 groups/nm$^2$. When silanol on the surface of the particles has a surface density within the above range, hydrophilicity of the silica particles is improved, and the polishing composition has improved dispersibility in water compared with a polishing agent containing a silica powder which has silanol in a surface density of less than 1 group/nm$^2$.

Surface density of silanol on the surface of the silica particles can be determined, for example, by the following method:

(1) First, silica sol is ion-exchanged to remove metal ions. Sodium hydroxide is added dropwise to the ion-exchanged silica sol (W g) to determine molar number (M) of sodium hydroxide required for the pH value to reach 8. Reaction in this case is considered to progress as follows:

$$Si\text{—}OH + NaPOH \rightarrow Si\text{—}ONa + H_2O$$

(2) Silica content (S weight %) of the ion-exchanged silica sol is determined by a drying method.

(3) Surface density of silanol is calculated by the following equation:

$$\text{Surface density (group/nm}^2\text{)} = \frac{\text{Number of silanol in silica sol}}{\text{Surface area of silica in silica sol}}$$

Number of silanol in silica sol = $M \times 6 \times 10^{23}$ (unit: group)

$$\begin{aligned}\text{Surface area of} \\ \text{silica in silica sol}\end{aligned} = \frac{W \times s}{100 \times 2.2 \times 10^{-21}} \times \frac{4\pi r^2}{\frac{4\pi}{3} \cdot r^3}$$

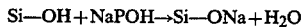

$$= \frac{3}{220} W \times S \times \frac{10^{21}}{r} \quad (\text{unit: nm}^2)$$

$$\text{Surface density (group/nm}^2\text{)} = \frac{M \times 6 \times 10^{23}}{\frac{3}{220} W \times \frac{1}{r} \times 10^{21}}$$

$$= \frac{440 \times M \times r}{W \times S} \times 100$$

wherein r denotes an average particle radius (nm) of silica particles.

Colloidal silica having silanol groups in a surface density of 1 to 10 groups/nm$^2$ is obtained by subjecting water glass, with reduced content of sodium ions thereof, and silicic acid to a condensation polymerization reaction to form silica particles. Details of a production method for such colloidal particles are described in Chapter 3 of "The Chemistry of Silica: Solubility, Polymerization, Colloid and Surface Properties, and Biochemistry", Ralph K. Iler, John Wiley & Sons (1979).

In particular, Iler states, at pages 239-244:
POLYMERIZATION ABOVE pH 7

"In the foregoing section it has been described in detail how at low pH silica polymerizes in stages to nulcei of silica which then increase in size to 2-3 nm. These particles then aggregate into chains, forming higher molecular weight polymers. Above pH 6-7 the behavior is entirely different. The ionization of polymer species is much higher so that monomer polymerizes and decreases in concentration very rapidly, even in a matter of minutes at 25° C. At the same time, the particles grow rapidly to a size that depends mainly on temperature. However, no aggregation or chaining together of particles occurs because they are charged and mutually repel each other.

All this is true provided the electrolyte concentration is low, as when silicic acid is prepared by hydrolyzing an ester or when the sodium or potassium cation is removed from a silicate solution to give pH 6-10.

Only above pH 7 can silica particles of suitable size be prepared and concentrated for industrial use, as discussed in Chapter 4.

Spontaneous Growth of Particles

Almost all the initial stages in the polymerization of monomer to oligomers and three-dimensional particles 1-2 nm in diameter occur in only a few minutes at above pH 7. Thereafter the polymerization involves only the increase in size and decrease in numbers of silica particles. At the same time, the concentration of monomer in equilibrium with these particles decreases as the average particle diameter increases.

Under conditions where the relative rate of aggregation of silica particles is low, the particles increase in size and decrease in numbers owing to "Ostwald ripening," a term commonly applied to the coarsening of crystals in a precipitate such as BaSO$_4$. As described in Chapter 1, small particles, especially smaller than about 5 nm, are much more soluble than larger ones. According to available data, particles of SiO$_2$ formed at 25° C. and not subsequently heated having the solubility of Curve B (citation to FIG. omitted), whereas particles made by hot processing (80°-100° C.) appear to follow Curve A.

The rate of growth depends on the distribution of particle sizes since the growth occurs by the more soluble smaller particles dissolving and the silica being deposited upon the larger ones. Generally, the distribution of particle sizes is not known but, with Gaussian distribution assumed, the increase in average particle size continues at a given temperature until the size is so large that the difference in solubility of smaller versus larger particles becomes negligible. The final size depends on the temperature.

The kinetics of Ostwald ripening has been examined mathematically by Sugimoto (citation to reference omitted), who derived equations for the change in particle size distribution with time. Iler has found that with a fixed SiO$_2$:Na$_2$O ratio the size to which particles grow is independent of the silica concentration. Silicic acid solution (3.7% SiO$_2$) was made by passing silicic acid through a H+ ion-exchange resin, adjusted with NaOH to a SiO$_2$:Na$_2$O ratio of 190:1 and vacuum concentrated at 35° C. to 7.7%. Samples were diluted to lower silica concentrations and heated at 100° C. for 48 hr and the particle sizes then determined by surface titration:

| % SiO$_2$ | Initial pH | Final pH | Particle Diameter (nm) |
|---|---|---|---|
| 7.75 | 8.59 | 9.9 | 13.5 |
| 3.0 | 8.91 | 9.9 | 13.4 |

-continued

| % SiO$_2$ | Initial pH | Final pH | Particle Diameter (nm) |
|---|---|---|---|
| 1.0 | 9.26 | 9.66 | 12.5 |
| 0.3 | 9.63 | 9.25 | 13.1 |

In a given sol at a given temperature, particle size appears to approach asymptotically a final value that depends on the temperature, as shown in Curve A (citation to FIG. omitted). It might be supposed that particle growth would continue over long periods of time until the specific surface area was reduced to zero. However, this does not occur. Sols of 15 nm particles have been stored at ordinary temperature at pH 9-10 for more than 20 years with only minor increase in particle size. Theoretically, if all the particles were exactly the same size, no growth would occur, but such was not the case, since some particles were at least three times as large as others.

Experience has shown that alkali-stabilized sols of silicic acid polymerize during a few months at 30° C. until the surface area slowly drops to about 500 m$^2$g$^{-1}$, corresponding to 5 nm particles, after which there is little change. At 90° C., the particles grow in a few days to around 7-8 nm, after which spontaneous growth is very slow.

Table 3.5 includes data by Alexander and McWhorter and Broge and Iler (citation omitted) who studied the particle growth during relatively long heating times at high temperatures under super-atmospheric pressure. The latter authors found that when the alkali-stabilized sols were heated to above 300° C., quartz crystals were produced instead of stable colloids.

TABLE 3.5

Growth of Silica Particles by Heating a 4% Sol of Silicic Acid at pH 8-10

| Mole Ratio SiO$_2$:Na$_2$O | Time | Temperature (°C.) | Specific Surface Area (m$^2$g$^{-1}$) | Estimated Particle Diameter (mμ) |
|---|---|---|---|---|
| 100 | 1 hr | 80 | 600 | 5 |
| 64 | 6 hr | 85 | 510 | 6 |
| 100 | 5 hr | 95 | 420 | 7 |
| 78 | 6 hr | 98 | 406 | 7 |
| 80 | 30 min | 100 | 350 | 8 |
| 85 | 3 hr | 160 | 200 | 15 |
| 85 | 3.25 min | 270 | 200 | 15 |
| 85 | 0.9 min | 250 | 225 | 15 |
| 90 | 3.1 min | 200 | 271 | 10 |
| 85 | 10 min | 200 | 228 | 12 |
| 85 | 10 min | 295 | 78 | 36 |
| 85 | 30 min | 295 | — | 64 |
| Very High[a] | 3 hr | 340 | — | 88 |
| Very High[a] | 6 hr | 340 | — | 105 |
| Very High[a] | 3 hr | 350 | 20 | 150 |

[a]Traces of sodium ions remaining in the starting particles after deionization of the sol before autoclaving resulted in a pH of about 8 in the final sol.

Rule (citation omitted) found that if a sol consisting of particles from 8 to 15 mμ in diameter is first thoroughly deionized and then autoclaved at 300°-350° C. under autogeneous pressure, there is insufficient alkali present to cause conversion to quartz, yet traces of sodium and hydroxyl ions occluded in the original particles are released during the growth process in amounts sufficient to raise the pH and stabilize the sol. In this manner, particles in the diameter range 88-150 mμ diameter were produced, and such products could be concentrated to a stable sol containing more than 50% by weight of silica. It is pointed out by Broge and Iler (citation omitted) that if the starting sol consists of discrete particles they grow as discrete spheres, but if they start as aggregates or as a gel structure, the final sol particles are of irregular shape, since they are formed by the densification of irregular aggregations.

The rate of particle growth is not proportional to concentration of OH$^-$ion in the pH range 8-10, but is only moderately influenced by it. Since the silica surface is a poor buffer, the pH rises as the particles grow and specific surface area reduced. Shown (citation to FIG. omitted) is a sol starting with particles 3.5 nm in size made by deionizing a solution of sodium silicate and adjusting the SiO$_2$:Na$_2$O ratio to various values. When held at 50° or 90° C. the particles grow very rapidly in the first 5 hr from the 3.6 nm size they had reached at 25° C. At 50° C. in 100 hr they grew to around 5 nm and at 90° C. to 7-8 nm, after which further growth was very slow when the pH was 7-8, but continued somewhat further when more alkali was present to give a pH of 8-10.

Final Size of Particles Versus Temperature

Obviously the rate of particle growth at a given temperature becomes exceedingly slow when the difference in solubility of the smallest versus the largest particles has become negligible.

Thus, at 90° C., for example, the solubility of massive silica formed is about 350 ppm, and the size above which growth is slow at 90° C. is about 8 nm. If we assume growth occurs until all the particles are within the size range of ±10% or 7.2-8.8 nm, then using the expression $10^{1.03/D}$, the range of solubility is between 1.39×350 and 1.31×350, or 487 and 459, that is, a solubility difference of 28 ppm.

At 30° C. the solubility of massive silica is 70 ppm (SiO$_2$ made at 85° C.) and growth becomes slow at 3.5 nm diameter. A similar calculation, assuming the expression $10^{0.92/D}$, gives for a ±10% spread in particles sizes a range in solubilities of 137-121, or a difference of 16 ppm.

It is therefore clear that the initial distribution of particle sizes about the mean in the initial sol will have marked effect on the final size reached when the sol is aged at some higher temperature. Aggregation may occur when a 2-4% silicic acid sol is made at pH 2-4 and then alkalized. At the low pH, and during the change of pH through the range around 5, colloidal aggregates or microgel are likely to be formed unless the operation is conducted rapidly. The aggregates may then act as larger particles or nuclei and the heat-aged sol will have a larger final particle size.

For a quantitative study of spontaneous growth, data are needed on the particle size distribution in alkali-stabilized sols of particles 3-15 nm diameter. Eventually such data may be obtained by stabilizing such sols at pH 2, diluted to around 1% concentration, and measuring the size distribution by ultracentrifugation or liquid chromatography."

Iler, in Chapter 4 (which is cross-referenced from Chapter 3) discusses colloidal silica-concentrated sols, at pages 312-315:

"The term 'colloidal silica' here refers to stable dispersions or sols of discrete particles of amorphous silica. By arbitrary definition, the term excludes solutions of polysilicic acid in which the polymer molecules or particles are so small that they're not stable. Such solutions, which are usually obtained by acidifying sodium silicate solutions or by hydrolyzing silicon esters or halides at ordinary temperatures, have been discussed in Chapter 3 as precursors of colloidal particles.

Stable concentrated silica sols that do not gel or settle out for at least several years became available in the 1940s, after it was learned how to make uniform colloidal particles larger than about 5 nm in diameter, stabilized with an optimum amount of base.

When Vail (citation omitted) in 1925 and Treadwell and Wieland (citation omitted) in 1930 reviewed the status of colloidal silica, only rarely could a silica sol containing more than 10% silica be obtained; such sols were not stable toward gelling. In 1933 the art was reviewed by Griessbach (citation omitted), who reported that a 10% sol stabilized with ammonia was made by I. G. Farbenindustries, A. G. In 1941 Bird (citation omitted) patented a process for removing the alkali from a dilute solution of sodium silicate by a hydrogen ion-exchange resin, adding back a small amount of alkali to stabilize the silica, and concentrating by heating to boil off water. It is now evident that under these conditions silica particles were grown to 5-10 nm in diameter. In 1945, White (citation omitted) patented a process of washing the salts out of silica gel made by acidifying a solution of sodium silicate, impregnating it with an alkaline solution, and then heating until most of the gel is peptized to a sol. These processes generally gave sols containing 15-20% silica, at least temporarily stabilized against gelling or settling out. In 1951 Bechtold and Snyder (citation omitted) developed the first process for making colloidal silica particles of uniform and controlled size, and Rule (citation omitted) further defined the optimum concentrations of alkali required for stabilization while limiting electrolyte impurities. The history of the development and the state of the art in about 1954 was summarized by Iler (citation omitted). Further refinements by Alexander (citation omitted) in controlling particle size, degree of aggregation, purity, and optimum concentration of stabilizing alkali led to stable sols of particles only 8 nm in diameter, yet containing more than 30% silica. Stable, translucent, aqueous sols containing up to 50% by weight of $SiO_2$ have been developed(citation omitted) by making particles 20-25 nm in diameter and adding an optimum amount of alkali for stabilization and sufficient salt to reduce the viscosity without destroying stability.

Sols containing discrete particles as large as 300 nm or more in diameter, which settle out on standing, have been made by autoclaving wet silica gel with a base under superatmospheric pressure and then breaking the lightly aggregated particles apart in a colloid mill (citation omitted).

Thus in the past 30 years methods have been developed for making discrete silica particles covering the whole range of colloidal size and stabilizing these as concentrated commercial sols.

A broad review of 'hydrosols' has been written by Napper and Hunter, including their preparation and properties (citation omitted).

GROWTH AND STABILIZATION OF DISCRETE PARTICLES

As discussed in Chapter 3 (see FIG. 2.1) silicic acid polymerized to form discrete particles in the pH range 7-10. No aggregation occurs if the concentration of electrolyte is generally less than 0.1-0.2 N, depending on silica concentration.

Because of the nonuniform distribution of particle sizes, especially when particles are smaller than 10 nm, spontaneous particle growth occurs. The particle size that is attained strongly depends on the temperature. As shown in Table 3.5, at 50°-100° C. particles reach 4-8 nm in diameter, whereas at 350° C. in an autoclave they may grow to 150 nm. This spontaneous growth is relatively independent of the silica concentration. The size of particles produced by autoclaving aqueous sols is limited at high temperature by the conversion of amorphous silica to crystalline quartz. Frye and McKay have shown that the rate of conversion under autogeneous pressure at 330° C. is proportional to the square of the hydroxyl ion concentration (citation omitted). Oehler (citation omitted) reported that after 4 weeks at 150° C. and 200 bars microspheres of crystalline tridymite 50 microns in diameter were formed.

Increasing Particle Size By Adding "Active" Silica

It was because of the small particle size of the colloidal silica made at ordinary temperature that stable concentrated sols could not be obtained. Because higher temperature was known to accelerate gelling, it seemed logical that sols should be made and kept at ordinary temperature. Hence the ultimate particle size seldom exceeded 2-3 nm. When a sol of this type was adjusted to pH 8-10 and vacuum concentrated at 20°-30° C. it gelled when the concentration reached about 10%. It was not realized that it could be heated and evaporated at 100° C. to a stable concentration of 10-20% because at the higher temperature the particle size increased to 4-6 nm.

However, to obtain still more concentrated sols, even larger particle sizes were needed. This was first achieved by the further deposition of soluble silica on the particles by adding silicic acid in the form of particles smaller than 5 nm, generally less than 2 nm in diameter or even smaller polymer species. These are 'active' in the sense that they are more soluble and dissolve in the presence of larger particles or 'nuclei' on which silica is deposited.

It was the process developed by Bechtold and Snyder (citation omitted) that first provided stable concentrated colloidal silica sols i=of any desired particle size from 10 to 130 nm in diameter. First a 3.5% solution of silicic acid is prepared by passing a solution of sodium silicate through a bed of hydrogen ion-exchange resin to remove sodium, and then enough alkali is added to raise the pH to above the neutral point, using around 1% by weight of $Na_2O$ based on the silica. This part of the operation follows the Bird process (citation omitted). However, instead of boiling down the solution directly, a portion is heated to 100° C., which converts the silica to particles at least 4-6 nm in diameter. Then the rest of the alkalinized polysilicic acid solution in which the particles are less than 3-4 nm in diameter is gradually added to the hot sol as it is concentrated by evaporation. By carrying out his addition sufficiently slowly, all the upcoming silica is deposited on the original particles, which thus are grown at a uniform rate. Water is usually simultaneously evaporated so that the total number of particles per unit volume remains constant, but they grow in size as the sol becomes concentrated. In the patent literature, the initial alkalinized sol containing the silica particles which act as nuclei has been termed a 'heel,' used in the sense of a 'residue' in a partly filled container to which more liquid may be added.

In a modification of the Bechtold and Snyder process, Rule (citation omitted) started with a heel of alkalinized sol but added a solution of polysilicic acid made by ion exchange to which no alkali has been added. The silica particles were thus grown in a medium of constant alkali content, so that stable concentrated sols were produced containing a minimum of stabilizing alkali. Albrecht (citation omitted) patented the optimum rate of addition of polysilicic acid in the Rule process for producing silica particles 45–100 nm in diameter. By operating a similar process under superatmospheric pressure, particles up to 150 nm in diameter have been produced (citation omitted).

Particles having a diameter of more than 100 nm have been prepared by Mindick and Vossos (citation omitted) by adding silica of average molecular weight below 90,000 to a sol heel having a pH of 7–11 and containing at lest 0.1% by weight of relatively uniform spherical silica particles with an average diameter of at least 30 nm. The rate of addition of feed is maintained below a maximum according to the relation $F_t = kS_tC_t$, where $F_t$ is the maximum feed rate at any time t, in grams of silica added per milliliter of mixture per hour, k is a predetermined rate constant equal to about 0.005 for a constant volume process at 100° C., $S_t$ is the specific surface area of the particles at time t, in square meters per gram of silica, and $C_t$ is the concentration of the silica in the mixture at time t, in grams per milliliter.

This method of increasing the size of silica particles is sometimes referred to as the 'buildup process.' Colloidal particles in which only the surface of the particles consists of silica, whereas the interior is another insoluble material, can be made by starting with suitable colloidal nuclei other than silica, using the buildup process. Thus it is possible to produce sols having the dispersion and surface characteristics of colloidal silica, yet with platelike or fibrous particles, by starting with colloidal dispersions of platelike or fibrous colloidal silicate minerals, oxides, metals, or other materials, according to a silica-coating process developed by Iler (citation omitted). In growing particles by this process 'active' silica must not be added to the system more rapidly than the available silica surface can take it up. Otherwise the solution becomes so supersaturated that new small nuclei are formed and then the final sol is not of uniform particle size. As shown in Chapter 1, at 90° C. the maximum rate of addition without nucleation is about 10 grams active $SiO_2$ per 1000 $m^2 hr^{-1}$ area of silica surface. The theoretical increase in particle size depends on the 'buildup ratio,' $B_r$ $$B_r = \frac{W_a}{W_n}$$

where $W_a$ is the amount of active silica added to the particles and $W_n$ is the weight of silica initially present as nuclei. Obviously, the particle diameter will be increased from the initial size $d_i$ to the final size $d_f$ in accordance with the following equation:

$$\left(\frac{d_f}{d_i}\right)^3 = \frac{W_n + W_a}{W_n}$$

$$\left(\frac{d_f}{d_i}\right)^3 = 1 = B_r$$

A process by which 15% sol can be made directly by ion exchange was developed by Iler and Wolter (citation omitted), whereby a heel of water or dilute sodium silicate is heated and stirred and then wet, drained, regenerated hydrogen ion-exchange resin (preferably of the weak acid type) and relatively concentrated sodium silicate solution are added simultaneously at such a rate as to maintain the pH at about 9. Depending on temperature and relative amount and size of the silica particles without further nucleation. A similar process is operated in a column or fluidized bed by which resin is continuously added at the top and withdrawn at the bottom in counterflow to the silica sol.

In a study of the growth of silica particles by adding monomer to a dispersion of preformed nuclei, Bartholin and Guyot (citation omitted) studied the formation of nuclei when low molecular weight silicic acid, made by ion exchange from sodium silicate, was aged at pH 8. The very pure sodium silicate was made from ethyl orthosilicate. In this case the 2.5% sol alkalinized to pH was stored at 4° C. to minimize spontaneous particle growth and, because of the high concentration of small particles, promote formation of microgel. When heated, the microgel aggregates condensed and shrank to more or less dense spherical particles around 100Å diameter. However, it should be noted that when the heating step from 4° to 80° C. is slow (2 hr) the nuclei are much more uniform in size than when the heating is rapid (10 min), as shown by the greater uniformity of the final sol obtained by adding freshly made silicic acid solution also adjusted to pH 8.

Additionally, Iler discloses methods of making sols, along with methods of purification and concentration, at pages 331–343:

METHODS OF MAKING SOLS

Many processes have been proposed and are employed for producing colloidal silica from low-cost sodium silicate solutions. Sols have also been made from hydrolyzable compounds such as ethyl silicate or silicon tetrachloride. To produce sols that are stable at a reasonably high concentration, it is necessary to grow the particles to a certain size under alkaline conditions where the particles remain negatively charged so they will not flocculate or gel. These particles should also be nonporous.

Colloidal silica is formed in nature when water is saturated with quartz at high temperature and pressure and the solution is removed and cooled. Such sols contain only a few tenths of a percent silica, but could be concentrated readily by ultrafiltration. The formation of colloidal silica in this manner was studied by Kitahara and Oshima (citation omitted), who also examined the rate of dissolution of the particles when the sol was diluted.

Neutralizing Soluble Silicates With Acids

When a dilute solution of sodium silicate is partially neutralized with acid to a pH of 8-9, a silica sol rather than a gel is obtained if the concentration of the resulting sodium salt is less than about 0.3 N, and if the neutralization is carried out at elevated temperature, so that the particles grow as soon as they are formed to several millimicrons in size. Thus a 3% silica sol may be made by partially neutralizing a dilute solution of commercial silicate with acid, according to the conditions patented by Alexander, Iler, and Wolter (citation omitted). A sol of silica nuclei is first made by removing sodium ion with an ion-exchange resin from a sodium silicate solution containing 2.2% $SiO_2$, until the weight ratio of $SiO_2$ to $Na_2O$ is 85:1. This dilute sol is then heated at 100° C. for about 10 min to form nuclei of desired size. Then dilute solutions of sodium silicate and sulfuric acid are added simultaneously while the mixture is stirred vigorously at 95° C. over a period of 8 hr and the pH is maintained at about 9. The concentration of sodium ions must not exceed about 0.3 N or aggregation of the particles will occur. Under these conditions the silicic acid formed by the added silicate and acid is deposited upon the silica nuclei, so that particles of 37 nm size, for example, are obtained.

In another patent, Alexander and Iler (citation omitted) describe the isolation of particles formed in the above process by coagulating them with a metal ion such as calcium, washing the precipitate free from sodium salt, and then peptizing the product to a more concentrated silica sol by removing the calcium ions by ion exchange, for example.

In making a sol by neutralizing a dilute solution of silicate with acid, it is essential that the mixing be carried out so rapidly that none of the mixture remains in the pH range of 5-6 for an appreciable time, since silicic acid gels almost instantly at this pH. This requires that the acid and silicate be mixed with intense turbulence, with either excess acid or excess silicate present to prevent local gelling. Even in the most critical pH region, around neutrality, a mixing procedure patented by Armstrong and Cummings (citation omitted) permits the formation of a uniform silicic acid solution at concentrations up to 20% $SiO_2$, which even under the most adverse pH conditions does not gel for a few minutes.

A different approach to making colloidal silica by reacting sodium silicate with acid involves making an acidic sol and precipitating the sodium salt in a strongly acidic medium. The polysilicic acid is temporarily stable at pH 2, and if the sodium salt of the acid used for neutralizing the silicate is sufficiently insoluble, it can be precipitated and separated. Once the sodium salt is separated from the acid sol, the polysilicic acid can be alkalinized to grow colloidal particles and stabilize the produce, or can presumably be used for other processes of growing silica particles to the desired size. Thus Teicher (citation omitted) neutralized sodium silicate with an acid to produce an acidic sol containing a miscible organic liquid, such as an alcohol, which precipitates the salt. An earlier process by White (citation omitted) precipitates the sodium sulfate from a sol made from sodium silicate and sulfuric acid by adding acetone. Marchegiet and Gandon (citation omitted) instead use a material that will form an extremely insoluble sodium salt, such as the reaction produce of sulfite ion and glyoxal, the sulfite being the acid used for neutralizing the alkali in the silicate. By reacting sodium silicate with oxalic acid to obtain an acidic sol, sodium is precipitated as sodium hydrogen oxalate, leaving about 0.13 N sodium ion in solution at 15° C. (85). The remaining salt can then be removed by ion exchange (citation omitted).

Electrodialysis

Colloidal silica has been made by various procedures involving electrodialysis whereby sodium ions are removed from a solution of sodium silicate to produce sol. These have been reviewed by Iler (citation omitted), but in no case were stable products made. Sanchez (citation omitted) and Iler (88) patented processes of electrolyzing alkali metal silicate solution to continuously remove alkali metal ions until a sol is obtained.

Electrodialysis may eventually replace ion exchange for making commercial sols because alkali, oxygen, and hydrogen could be recovered and there is much less waste water containing salts to be disposed of. In the Iler process, there are three compartments. In the anode compartment sulfuric acid solution is circulated around a lead anode and in the cathode compartment where a sodium hydroxide is generated, the alkali is circulated round the steel cathode. These are located on opposite sides of two parallel, closely spaced cation-exchange membranes between which the process solution is rapidly circulated at 60°-90° C. The process solution is a silica sol containing about $0.05N$ $Na_2SO_4$ as a conducting or supporting electrolyte. A solution of sodium silicate is added to the entering process stream to raise the pH to 9.5. The current density and rate of flow of the process stream are adjusted so as to reduce the pH to no less than 8 as the stream leaves the cell. The liberated silica is deposited on the silica particles which are thus grown to desired size. A 25% silica sol of 15 nm particles can be prepared directly by this process. The electrolyte is then removed by ion exchange, the pH adjusted for optimum sol stability, and the sol concentrated to 30-50% silica.

There is essentially no consumption of acid except the small amount needed at the start of each batch to neutralize a dilute solution of sodium silicate (0.5% $SiO_2$) to pH 9 at 60°-90° C. to form silica nuclei to start the process. A narrow uniform spacing between the membranes is required to minimize power cost and avoid silica deposition. Water is added to the anode compartment since it is slowly transported to the cathode compartment, from which sodium hydroxide solution is constantly withdrawn. Anolyte and catholyte are circulated from the corresponding electrode compartments to separators for the removal of oxygen and hydrogen gases.

A process using a mercury cathode to remove sodium from sodium silicate is patented by Vaquero (citation omitted). No supporting electrolyte is used so that as the alkali becomes depleted the high electrical resistance of the sol increases the power required. A three cell arrangement using ion-exchange membranes for making sols by electrodialysis was discussed by Prajapati and Talpade (citation omitted). No supporting electrolyte was used. The final so pH was 2-3.

A type of electrolytic process patented by Tripp (citation omitted) is used to dissolve an anode of silicon metal in alcohol containing a metal salt catalyst such as copper sulfate to produce a silica organosol.

In a study of transport of silica through membranes during electrodialysis, Boari et al. (citation omitted) found that no transport or silica deposition occurred unless the pH was such that $HSiO_3$-ions were present. This is consistent with the observation that it is necessary to carry out electrodialysis at less than pH 9.5 (citation omitted) in order not to deposit silica in the membrane.

Ion Exchange

The pioneering work of Bird (citation omitted) by which sodium was removed from sodium silicate by ion exchange, after which the sol was concentrated by evaporation at atmospheric pressure, led to one of the earliest stable silica sols containing around 20% silica. Further advances by Bechtold and Snyder (citation omitted) permitted control of particle size, and other modifications, relating to permissible salt concentration and optimum alkali content, by Alexander (citation omitted and Atkins (citation omitted) led to the production of a series of concentrated sols covering a wide range of particle sizes. Thus far, the silica sols were made by passing relatively dilute sodium silicate solution through abed of ion-exchange resin to produce an acidic sol relatively free from sodium, which was then stabilized and the particles grown as desired. An alternative approach was invented by Wolter and Iler (citation omitted), in which the hydrogen ion-exchange resin and sodium silicate were added to a weakly alkaline aqueous reaction medium in the pH range around 9, at elevated temperature. The silica particles grew continuously under these conditions where they were stabilized against aggregation, so that relatively concentrated sols in the range 10–15% silica were produced directly. An alternative procedure for making a relatively concentrated 12% acidic sol of polysilicic acid has been patented by Mindick and Reven (citation omitted), whereby the silicate solution is cooled and passed through an ion exchanger so that the concentrated sol is formed at low temperature to avoid gelling.

Many variations in the ion-exchange procedure have been proposed. Dirnberger (citation omitted) showed that more concentrated sols can be made without gelling by passing the silicate upward through the ion-exchange resin bed, keeping the resin in suspension. Other variations in the ion-exchange process have also been patented (citation omitted).

The last trace of electrolytes can be removed from silica sol produced by conventional means by heating and again passing it through a hydrogen ion resin to remove alkali liberated from the particles, according to Mindick and Reven (citation omitted).

The use of a cation-exchange resin in ammonium form permits removal of sodium from sodium silicate solution without exposing any part of the solution to low pH where aggregation can occur. Wolter found that a 3.25 ratio silicate solution containing up to 5% $SiO_2$ could be passed through a column of ammonium resin without gelling. More silicate can be added to the alkaline effluent and the solution again treated with ammonium resin (citation omitted).

For sols of very small particle size, Shannon (citation omitted) added sodium silicate to an acidic suspension of resin until the silica concentration reach 8%. The sol was removed and alkalinized with NaOH and $NH_3$ to have 1% Na and 3% $NH_3$ based on the $SiO_2$.

When making silicic acid by passing a solution of sodium silicate containing more than 3–4% $SiO_2$ through a bed of hydrogen ion-exchange resin, silica gel is formed within the pores of the conventional resin. This not only results in a loss of silica and the need to clean the bed, but also causes the resin granules to disintegrate. According to Hoffman (citation omitted) a silicic acid effluent containing up to 6% $SiO_2$ can be made without these difficulties if one uses a macro-reticular cation-exchange resin (Amerlite IR-200) having pores about 10 nm in diameter, a porosity of 32%, and a surface area by nitrogen adsorption of 42 $m^2g^{-1}$. The resin is treated with caustic solution to remove small amounts of silica after each use and before regeneration.

Ion exchangers can be regenerated electrolytically according to Matejka (citation omitted).

Instead of an ion-exchange resin, a cation-exchange membrane can be used to remove sodium from a silicate solution into sulfuric acid (citation omitted). A hot sol of nuclei particles is circulated rapidly through tubing of ion-exchange polymer which is immersed in dilute sulfuric acid. Sodium silicate is added to the sol at a rate to maintain the pH around 8–10 and the liberated silica is deposited on the sol particles, thus increasing their size. Some sulfate ions penetrate the membrane so that the concentration of sodium sulfate in the sol slowly increases with time. The sol can be purified and concentrated by ultrafiltration, but the sol concentration must be maintained so that the sodium in normality N does not exceed $N=0.26°-0.005°$ C.$-0.0012$(T-40), where C is grams of $SiO_2$ per 100 ml and T is the temperature in degrees centigrade.

Peptizing Gels

As early as 1864, Thomas Graham reported that silica gel could be liquefied by a trace of alkali, which he described as 'peptization of the jelly.' In 1922, Praetorius and Wolf (citation omitted) produced silica sol from a gel by heating it in water at elevated temperature and pressure. Neundlinger (citation omitted) prepared sols containing about 10% silica by treating the gel first with ammonia and heating without evaporating water until a sol was produced. Improved similar processes were invented by White (citation omitted) and Trail (citation omitted).

A modification of the preparation of sol from gel is described by Ahlberg and Simpson (citation omitted), who formed the gel under alkaline conditions by incompletely neutralizing the alkali of a silicate such as sodium silicate with less than the equivalent acid, then washing out the salts and heating the wet gel to peptize it. Much higher conversion of gel to sol is claimed than when an acidic gel is first made. Characteristics of sols made by this process are not available, but probably sols 15–45 nm in diameter were produced. A similar process has been described by Legal (citation omitted). Conversion of gel to sol in an autoclave to obtain a 30% ammonia-stabilized sol was patented by Mertz (citation omitted). The effect of ultrasonic dispersion of silica gel was examined by Bubyreva and Bindas (citation omitted).

Hydrolysis of Silicon Compounds

In 1944, Radczewski and Richter (citation omitted) reported that very pure silica sols prepared by hydrolyzing silicon tetrachloride from which the acid has been removed to give a pH of 6.8 formed spherical particles up to 200 nm in diameter, and that these appeared to be spongelike under the electron microscope. More recently, Stober and Fink (citation omitted) discovered that very uniform spherical silica particles of almost any desired size up to 1 micron could be made by hydrolyzing a lower alkyl silicate in an alcohol medium containing suitable amounts of water and ammonia. Subsequently, Flachsbart and Stober (citation omitted) were able to incorporate certain radioactive tracers without affecting the growth of the silica particles during their formation, but it was not certain whether the metals were homogeneously incorporated throughout the spheres. Particle sizes from 50 to 900 nm in diameter were produced. It is likely that the large spherical particles are actually spherical aggregates of much smaller particles, 10 nm or less in size, as described by Radczewski.

According to Brinsmead and Brown (citation omitted) a 'silicic acid sol' containing 43% $SiO_2$ was made by refluxing a mixture of ethyl silicate and isopropyl alcohol to which a dilute aqueous solution of acid was slowly added to furnish a stoichiometric amount of water for hydrolysis. There was no evidence that hydrolysis was complete, as would be shown by complete miscibility with water, nor any indication that discrete silica particles had been formed.

Sodium silicate can be hydrolyzed if sufficiently diluted. Thus a dilute solution of high ratio sodium silicate can be hydrolyzed in an autoclave to form colloidal particles which coagulate to a precipitate if the sodium ion concentration is sufficiently high. Schnurch and Koster (citation omitted) report that when a solution of sodium silicate with a $SiO_2:Na_2O$ weight ratio of 3.89:1 is diluted to 20 gl$^{-1}$ of $SiO_2$ and heated 1.5 hr at 150° C., 38% of the silica is precipitated as fine silica.

Dissolution of Elemental Silicon

If pulverized silicon metal is first treated to remove the oxide film with hydrofluoric acid, it reacts rapidly with water in an alkaline medium, particularly ammonia, to form colloidal silica which is stabilized by the alkali. This type of process has been patented by Balthis (citation omitted); the process is accelerated by carrying out the reaction while grinding the silicon (citation omitted).

Sols made from elemental silicon range from 8 to 35 nm in diameter, and under some conditions up to 150 nm. The process and the nature of the product has been discussed under the heading of 'porous particles.'

To make sols containing up to 50% $SiO_2$ by dissolving silicon, Bobb (citation omitted) claims the use of an aqueous solution of an inorganic base (NaOH, KOH) to catalyze the dissolution at 50°-100° C. and stabilize the resulting sol. It is remarkable that sols made at 90°-95° C. were said to be very viscous but when made at 98°-100° C. were of normal low viscosity. Particle sizes were between 15 and 45 nm. Also the sols were unusual in that they did not form hard gels when acidified, but only soft coacervates. These differences are unexplained. An alcosol is obtained when silicon is used as an anode and dissolved by electrolysis in an alcohol-water mixture. Acid or a metal salt is added to provide conductivity according to Tripp (citation omitted) or Chilton (citation omitted).

Dispersion of Pyrogenic Silica

Silica vaporizes only at very high temperature, around 2000° C., but if a reducing agent is present so as to form silicon monoxide, Sio, the sublimation temperature is 1700° C. As the monoxide evaporates in an oxidizing atmosphere, the dioxide is condensed in an extremely finely divided form. Ethyl silicate can be oxidized and the resulting $SiO_2$ vapor condensed. The most common process involves the combustion of silicon tetrachloride with natural gas, forming hydrogen chloride and silicon dioxide vapor, which condenses to a very voluminous powder. By controlling combustion conditions, presumably in a manner similar to that employed in making carbon black, products of different ultimate particle sizes and degrees of coalescence of the particles can be made. Another process involves vaporizing silica in an electric arc and condensing the resulting vapors. Powders of this type are considered here only because colloidal dispersions can be made from some of them. The processes involved and the silica powders are discussed in Chapter 5.

Dispersion of silica to a sol of separate, discrete ultimate particles is difficult because the particles are coalesced to varying degrees. Also in many cases, the surface is partly anhydrous with only a few hydrophilic silanol groups. For these reasons the properties of sols of this type are generally different from those made in aqueous solution. They do not form strong gels and are of little use as an inorganic binder.

The patent literature suggests that intense mechanical shearing forces, both on the dry voluminous powder and on the subsequent suspension in water, are required to attain reasonable dispersion in water or polar organic liquids. In water, wetting agents are used to promote wetting of the hydrophilic siloxane surface areas and alkali to promote surface hydration and dispersion (citation omitted).

A more stable dispersion is obtained by adding to the silicon tetrachloride a certain amount of titanium or aluminum chloride to produce silica containing a small amount of the metal oxide. Very stable concentrated sols containing 40-60% solids are obtained (citation omitted). A silica produced by flame hydrolysis by Degussa, for example, containing 1.3% aluminum oxide based on the silica (Aerosil® MOX), is sold particularly for making concentrated aqueous dispersions with ultimate particles in the range of 20-40 nm diameter, along with many smaller ones (citation omitted).

Flame-hydrolyzed silica with specific surface areas in the range of 200-400 $m^2g^{-1}$, under the name of Cab-O-Sil® is dispersible in water at pH 9 with ammonia, for example, to give sols up to 30% by weight of silica, provided the material is passed through a homogenizer to break apart the three-dimensional network of ultimate particles. The resulting particles still consist mainly of chainlike aggregates which increase the viscosity (citation omitted).

In general, the 'fume' or 'flame hydrolysis' process does not yield silica that is dispersible in water to give sols of discrete particles with the low viscosity at high concentration that is characteristic of sols made by aqueous polymerization processes. Nevertheless, with enough processing, pyrogenic silicas of ultimate particle size of 10-25 nm can be disaggregated and dispersed to aquasols containing up to 40% silica with suitable mechanical treatment and dispersing agent.

Extremely finely divided silica, composed of particles only 25-50 Å in size and having a specific surface area as high as 1000 $m^2g^{-1}$ has been made, according to Spencer, Smith and Cosman (citation omitted), by treating moist carbon black with dimethyldichlorosilane and then burning away the organic material in air at 500° C. The resulting silica, amounting to 4% of the original weight of the carbon black, was an opalascent powder in the form of small spheres, about 1 mm in diameter, of about the same size as the carbon black pellets. The specific surface area of the silica was 1094 $m^2g^{-1}$, indicating an ultimate particle size of 2.5 nm. The material dispersed easily in water, with the particles forming chains up to 20 microns long, suggesting that they were partially hydrophobic.

Colloid milling of pyrogenic silica in water in the presence of boric acid or alkali borate is disclosed by Clapdale and Syracuse (citation omitted). A 30% sol can be prepared. Some additional patents on making sols from pyrogenic silica mainly involve the use of alkali stabilization with sodium silicate, sodium hydroxide, hydrazine, hydroxylamine, or mixtures with pyrogenic metal oxides (citation omitted).

PURIFICATION, CONCENTRATION, PRESERVATIVES

Sols made by some processes contain slats or other materials that must be reduced or removed before the sol is finally concentrated.

Ion Exchange

Special purification procedures to remove salts form the final concentrated sols usually involve treatment with ion-exchange resins to remove soluble salts and then stabilization with a minimum of base, including ammonia, to obtain a sol of maximum purity, according to Rule (citation omitted). The method has become so commonplace s to require no further discussion. Sodium is difficult to remove after particles have been formed; Schaefer and Gamage use an alkanolamine as the base during particle growth (citation omitted).

Dialysis and Electrodialysis

Dialysis is the oldest purification procedure for removing soluble impurities from sols. Once dilute silica sol had been by reacting acid and silicate, or by hydrolyzing a material such as silicon tetrachloride, it was early recognized that purification required removal of the electrolyte. Graham (citation omitted), one of the earliest investigators of silica sols, in 1861, used dialysis to remove the electrolytes from the silica and thus prepared relatively pure colloidal silica. Since dialysis is relatively slow, it is not much used on an industrial scale. A more rapid process, not requiring tubing or flat membranes, has been proposed which involves passing the sol through a column or bed filled with a swollen polymer gel with such a fine pore structure that soluble salts, but not colloidal particles, can penetrate. The gel may be of regenerated cellulose or gelatin cross-linked with formaldehyde. The bed is regenerated by washing out the salt (citation omitted).

More rapid purification can be effected by electrodialysis where a direct current transports ions to the membranes. Improvements are constantly being made in equipment, especially for desalting seawater. However, for purifying silica sols the process has not replaced the use of ion-exchange columns, in which the investment is lower.

Washing Procedure

Methods that concentrate the sol particles but not the soluble components can be used to purify the sol by rediluting the concentrated sol with pure water and repeating the process.

Sedimentation by gravity is generally too slow, but centrifuging permits reasonably rapid concentration of silica particles larger than about 30-50 nm. Alternatively, silica can be flocculated with divalent metal ions and the precipitate washed free of soluble salts, then peptized by removing the flocculating ion. Alexander and Iler (citation omitted) used ions such as $Mg^{2+}$, $Ca^{2+}$, and $Ba^{2+}$ and removed them by ion exchange or, in the case of $Ba^{2+}$, precipitation as the insoluble sulfate.

Concentration by ultrafiltration or electrodecanting can also be used as part of the washing procedure.

Concentration

A variety of methods for concentrating sols are available but evaporation of water has remained the most common industrial procedure. However, with rising cost of power and steam, other known methods will not double be considered.

Evaporation of Water

For stable sols such as colloidal silica, forced circulation evaporators have been generally used. Special precautions must be taken not to permit the sol to become too concentrated or to reach dryness at any point on the equipment walls and especially on the heat exchange surfaces. If this occurs, a layer of hard adherent silica is built up. The problem becomes acute as the silica approaches the final high concentration with increasing sol viscosity.

Evaporation has the advantage that high temperature often plays a significant role in consolidating the structure of somewhat porous silica particles that were made at lower temperature and also in contributing to further growth in particle size.

Centrifugation

This is generally used for removing debris and clarifying silica sols but not for concentrating them. Unless the particle size is greater than about 30 nm, very high speeds are required. Hence the method is not practiced for most commercial sols.

Ultrafiltration

Remarkable advances have been made in the last 20 years in equipment and membranes used in the process of ultrafiltration (citation to FIG. omitted). Basically, the process removes water and small ions and solutes from a sol or colloidal suspension, which is thus concentrated without forming a filter cake or deposit on the membrane filter.

This technique is becoming increasingly important for purifying and concentrating colloids with minimum consumption of energy. Thus a process described by Iler (citation omitted) makes it possible to make colloidal silica by partly neutralizing a hot solution of sodium silicate with acid at such dilution that the resulting particles are not coagulated by the sodium salt. The sol (2-3% $SiO_2$) is cooled to 50° C. and concentrated by ultrafiltration while salt is simultaneously washed out by adding water. To avoid aggregation or formation of microgel, the water must be added at such a rate as to keep the salt concentration below a certain normality N where $$N = 0.26 - 0.005C - 0.002(T-40)$$

and C is the concentration of silica in grams per 100 ml. The temperature, T° C., is gradually raised to 75° C. while the salt normality is reduced to below 0.15 N and C is increased to 10. Ultrafiltration and washing are continued until a stable 30–40% sol is obtained. Sols of particles smaller than 10 nm require that during the process, the salt level be kept somewhat lower than with larger particles.

Reducing the pH of a silica sol to 2–4 before concentrating by ultrafiltering was proposed by Chilton (citation omitted). However, such sols are unstable at high concentration and especially at high temperature where ultrafiltration is much more rapid.

Improved membranes have been the key to recent advances in ultrafiltration. The finest filter papers have pore diameters of as small as 1000 nm (1 micron) whereas ultrafilter membranes can be made with pore diameters from 1000 nm to as small as 2–3 nm. For many years 'cellophane' or freshly formed films from collodion (nitrocellulose) were used, but now a number of manufacturers supply strong, flexible, and durable membranes of remarkably uniform pore size yet with high porosity, permitting rapid flow of water. Porous glass membranes have also been developed as well as porous carbon. Porous ceramic with a microporous coating provides an ultrafilter highly resistant to high temperature and chemical attack.

The development of membrane ultrafiltration for the chemical process industry was described by Michaels (citation omitted), who reviewed the basic principles, equipment, and types of applications. The useful ranges of available separation processes for molecules and particles of different sizes were compared by Porter and Michaels (citation omitted). Available membranes were described with pores of uniform sizes of selected diameters over the range 1–20 nm (10–200 Å). A bibliography of applications has been compiled (citation omitted). Equipment and information are available from a number of manufacturers, representing a wide range of apparatus design and membrane construction.

A better understanding of the basic principles of ultrafiltration has permitted the development of much more efficient equipment and corresponding commercial applications. A detailed consideration of the theory of ultrafiltration was published by Porter (citation omitted), who dealt specifically with the problem of 'concentration polarization.' (Citation to FIG. omitted.) The movement of particles toward the membrane results in the formation of a concentrated sol layer of high viscosity. This can reduce the flux or rate of filtration to a small fraction of that of the liquid medium in the absence of colloid. The resistance to flow is not due to plugging of pores, or even to an actual solid layer (gel) of close-packed colloidal particles. It has been observed by Iler that the resistance is a direct function of the high viscosity of the concentrated sol layer. When water above is flushed through the system, the particles diffuse away from the boundary layer and water passes at the original flux rate. During operation the concentration of colloid becomes 'polarized' in the sense that it becomes more concentrated near the surface of the ultrafilter and concentrated farther away from it. This polarization is completely reversible.

To maintain a high flux the thickness and concentration of the colloid layer at the filter surface must be minimized by creating high shearing forces in the liquid near the surface. This is done by increasing the linear rate of flow of sol past the surface and especially by turbulent flow. On small laboratory ultrafilters with a horizontal membrane, high turbulence is maintained by a mechanical stirrer located very close to the membrane. Under otherwise constant conditions, the flux rate decreases rapidly with increasing sol concentration. In general, increasing the pressure on an ultrafilter is less important than minimizing concentration polarization.

Flux increases rapidly with increasing temperature. Hence, where possible, process solutions should be ultrafiltered at maximum feasible temperature.

LIMITATION ON SALT REMOVAL BY ULTRAFILTRATION

Ultrafiltration with continued addition of water is an efficient way to remove salts down to a concentration of 0.03 N even from a concentrated silica sol. At these low levels there is a tendency for the salt to remain associated with the charged surface of the colloidal particles. This may be a hitherto unrecognized phenomenon, at least in the chemistry of colloidal silica, but it must have been noted during removal of salt from other ionic colloids. It is suggested that in dilute sols where the charged particles are far apart and there is a high concentration of sodium counter ions around the particles, there is a tendency for sulfate ions to be concentrated as a secondary layer outside of the layer of sodium ions. (Citation to FIG. omitted). Around each silica particle there is a boundary layer containing a preponderance of Na+ ions. Immediately outside of this there must be a secondary layer that contains a greater number of negatively charged sulfate ions than of positive sodium ions. Thus there tends to be a higher concentration of sulfate ions in the neighborhood of the particles than in the intervening water, so that there is less sulfate in the filtrate.

The effect becomes marked in sols of small particles containing less than 20% silica at pH 9. By measuring the concentration of $SO_4^{2-}$ in the ultrafiltrate and in the sol the following typical observations were made. To 6.5 liters of 9% $SiO_2$ sol of 6 nm particles at pH 9 containing 0.004 N sodium sulfate, 10 liters of wash water was added while removing filtrate to keep the sol at constant volume. Calculations show that this should have reduced the salt content to 0.009 N, but actually it was 0.022 N. Simultaneous analyses verified that the concentration of sulfate in the filtrate was less than in the sol during the operation. In the final sol there were present 0.15 sulfate ions and 0.8 counter sodium ions per square nanometer of silica surface. It is of course possible to further reduce the sulfate content by continued washing, but this process soon becomes very inefficient.

EFFECT OF MICROGEL IN SILICA SOL

The most critical factor in using ultrafiltration to concentrate silica sols is the presence of microgel or silica aggregates which are of the order of half a micron or more in size. Aggregates this large diffuse so slowly in comparison with single particles that they are carried by the flux to the membrane surface where they are deposited irreversibly as gel and reduce the flow of water and ions. In a series of ultrafiltration tests on a 4% $SiO_2$ sol the flux was reduced by 50% when only 0.5% of the silica was present as microgel and by 80% when 1.5% was present. Thus as little as 200 ppm of silica in suspension caused an immediate, serious reduction in flux."

The polishing composition according to the present invention contains a water-soluble polymeric compound. The polymeric compound serves to form a regular laminar flow between a polishing cloth and the surface of the wafer in the sliding direction of the polishing cloth to make the wafer surface even more smooth.

The water-soluble polymeric compound includes polymers of acrylamide, acrylic acid, methacrylic acid, maleic acid, ethylene oxide, and vinylpyrrolidone, or copolymers of these monomers, copolymers of hydroxypropylcellulose and maleic acid with a vinyl monomer, guar gum, a graft copolymer of guar gum with a vinyl monomer, a graft copolymer of xanthane gum with a vinyl monomer, and schizophyllan. Particularly preferable water-soluble polymeric compounds are polyacrylamide, a copolymer of acrylic acid and acrylamide, a graft copolymer of guar gum with acrylamide, and schizophyllan.

These compounds preferably have molecular weights of 100,000 or more. If the molecular weight is less than 100,000, a laminar flow is not formed between the polishing cloth and the surface of wafer during polishing, which is undesirable. Molecular weight of the polymeric compound used in the present invention is referred to that measured by a light scattering method (e.g., refer to Shin Jikken Kagaku Koza (New Experimental Chemistry), vol. 19, pp. 571–585, published by Maruzen in 1978).

The water-soluble polymeric compound is prepared using the following procedures.

Polyacrylamide, a copolymer of acrylamide and acrylic acid, polyacrylic acid, polymethacrylic acid, polymaleic acid, polyethylene oxide, and polyvinylpyrrolidone can be prepared by polymerization of the corresponding monomers using a conventional method known in the art.

Vinyl monomers which are copolymerizable with maleic acid include methylvinylether, ethylvinylether, and isobutylvinylether. Copolymers of maleic acid with these vinyl monomers can also be produced by a conventional method known in the art.

Guar gum is referred to viscous galactomannan contained in an albumen of seed of guar, a leguminous plant.

Vinyl monomers to be graft copolymerized with guar gum include acrylic acid, methacrylic acid, styrenesulfonic acid, and acrylamide. One or more types of vinyl monomers can be graft copolymerized.

Graft copolymerization of the polymeric polysaccharide with vinyl monomers can be achieved using methods such as those described in detail in Journal of Applied Polymer Science, vol. 30, 4013–4018 (1985) and vol. 32, 6163–6176 (1986).

For example, when guar gum is graft copolymerized with acrylamide, an aqueous solution containing 0.01 to 2.0 weight % of guar gum is mixed with 1 millimole to 1 mole of acrylamide and 1 micromole to 10 millimole of a polymerization initiator per 1 g of guar gum, and the mixture is reacted at a temperature of 0° to 100° C. in the air or in an inert gas atmosphere. The polymerization initiator is preferably cerium ionic radicals, and it is preferable to use guar gum as of higher purity as possible.

Schizophyllan is a polymeric polysaccharide extracted from suehirotake.

Content of the water-soluble polymeric compound in the inventive polishing composition is typically 1 ppm or more and, specifically, preferably 10 to 1,000 ppm. When a wafer is polished using a polishing composition having a content of the water-soluble polymeric compound within this range, a laminar flow is formed in the sliding direction between the polishing cloth and the wafer surface, thereby making the wafer surface even smoother. However, if the content is less than 1 ppm, it is difficult to form the laminar flow, and, if the content exceeds 1,000 ppm, a turbulent flow tends to be formed; both cases are undesirable.

The inventive polishing composition contains a water-soluble salt. The water-soluble salt has a function to reduce the thickness of hydration layer on the surface of silica particles in the slurry-formed final polishing composition. This increases the kinetic action of the silica particles exerting on the wafer during polishing with the polishing composition, thereby increasing the mechanical polishing effect and improving the polishing efficiency.

The water-soluble salt includes, but is not restricted to, compounds comprising combinations of a cation selected from the group consisting of sodium, potassium, and ammonium, and an anion selected from the group consisting of fluoride, chloride, nitrate, and perchlorate. These water-soluble salts can be used alone or in combination of two or more types. Of these, potassium chloride and ammonium chloride are particularly preferable which are high in degree of ion dissociation and large in atomic radius of cation.

Content of the water-soluble salt in the inventive final polishing composition for a wafer is typically 20 ppm or more. The thickness of hydration layer formed on the surface of silica particles can be reduced by the addition of the water-soluble salt, however, if the content is less than 20 ppm, a sufficient effect of the salt is not obtained, which is undesirable.

As needed, the inventive final polishing composition for a wafer can be mixed with an alkaline compound to adjust the pH value of the composition to 8 to 12.

As the alkaline compound, hydroxide of an alkali metal, as amine, or ammonia can be used. The alkali metal hydroxide includes potassium hydroxide, sodium hydroxide, rubidium hydroxide, and cesium hydroxide. Of these, potassium hydroxide and sodium hydroxide are particularly preferable. The amine includes triethylamine, triethanolamine, monoethanolamine, diisopropanolamine, ethylenediamine, tetraethylpentamine, triethylpentamine, diethylenetriamine, and hexamethylenediamine. Of these, ethylenediamine is preferable.

The present invention has the following advantageous effects and is thus very important for use in industrial applications.

(1) When a wafer is polished using the inventive final polishing composition, the water-soluble polymeric compound forms a laminar flow between the polishing cloth and the wafer, thereby preventing occurrence of a turbulent flow. Therefore, a smooth polished surface is obtained which has no irregularities detectable by a differential interference microscope.

(2) Since the inventive final polishing composition contains colloidal silica as silica particles having on the surface silanol groups in a surface density of 1 to 10 groups/$nm^2$, it has a high hydrophilicity of silica particles and an improved dispersibility in water, compared with a polishing agent which contains a silica powder containing silica particles having on the surface silanol groups in a density of 1 group/nm$^2$ or less.

(3) When a wafer is polished using the inventive final polishing composition, because the thickness of hydration layer on the surface of colloidal silica particles in the slurry is small due to the function of the water-soluble salt contained in the composition, kinetic action of the silica particles exerted on the wafer when the silica particles impinge upon the wafer during polishing is increased, thereby increasing the mechanical polishing effect, and thus the final polishing efficiency is improved over that for polishing with a composition which does not contain the salt.

DESCRIPTION OF THE PREFERRED EMBODIMENTS

The present invention will now be described further in detail with reference to examples and comparative examples, but these examples are not intended to limit the invention. Examples 1–15, Comparative Examples 1–2.

(1) Preparation of guar gum graft-copolymerized with acrylamide

Polymeric guar gum (from Sansho, named Meipro Gut 120) was dissolved in water to obtain a 0.5% aqueous solution. The solution was purified using filtration and alcohol dissolution techniques. The purification was carried out using the following procedures:

First, using a mesh filter having a pore size of 1–10 microns, coarse impurities were removed from the guar gum aqueous solution by the filtration method. Since guar gum is insoluble in alcohol, the guar gum aqueous solution was poured into alcohol to dissolve alcohol-soluble substances, and the precipitated substance was retrieved. The precipitated substance was dried, and again dissolved in water to obtain a guar gum aqueous solution of a predetermined concentration, 1 weight % in this example.

One liter of the thus obtained 1 weight % aqueous solution was mixed with 0.5 mole of acrylamide under stirring and purging with nitrogen, and then mixed with 0.3 millimole of cerium ammonium nitrate as a polymerization initiator and reacted for 24 hours at room temperature under further stirring to obtain acrylamide-grafted guar gum (hereinafter referred to as "GGG").

(2) Preparation of polishing composition

Colloidal silica having an average particle diameter of 60 millimicrons, containing 50 weight % of silica particles, and having silanol on the surface of the particles in a surface density of 8 groups/nm$^2$; GGG, an aqueous solution (0.5 weight %) of polyacrylamide (from Mitsubishi Kasei, named Diaclear MN3000) (hereinafter referred to as "PAAM), schizophyllan (hereinafter referred to as "SPH"), as the water-soluble polymeric compounds; and KCl as the water-soluble salt were weighed in ratios shown in Table 1, and mixed with pure water to obtain polishing compositions containing 1 weight % colloidal silica. However, for Comparative Example 2, silica powder (from Nippon Silica Kogyo, named Nipseal E220A, having silanol in a surface density of 1 group/nm$^2$ on the particle surface) was dispersed in pure water in an amount of 1 weight %.

(3) Final polishing tests of wafer

Using the SPAW36 Polisher of Speed Fam and a soft, suede-type polishing cloth, a silicon wafer, having completed primary polishing, was polished while supplying the polishing composition at a rate of 1 liter per minute. Polishing pressure was 100 g/cm$^2$, relative speed between the wafer and the polishing cloth was 1 m/sec, and temperature of the polishing cloth during polishing was 40° C.

Time was determined until the surface of the wafer became smooth by polishing using the polisher (whether or not the surface was smooth was observed by a differential interference microscope in the course of polishing). The results are shown in Table 1.

After polishing by the polisher, the wafer was rinse polished with flowing water in place of the polishing composition to remove silica and polymeric polysaccharides from the surface of the wafer. Time required for rinse polishing was determined (end point was determined by observation of the wafer surface with the differential interference microscope).

(4) Silica particle dispersion tests of polishing compositions

A slurry-formed final polishing composition was put in a capped test tube of 5 cm in height and 100 cc in volume, which was allowed to stand for one day. The test tube was subjected to repeated cycles of turning upside down and then reverting back to the original position, and condition of silica particles uniformly dispersing in the slurry was observed visually to determine the number of cycles required for uniform dispersion.

TABLE 1

| Item No. | Water-soluble polymeric compound Type | Content (ppm) | Water-soluble salt Type | Content (%) | Alkaline substance Type | pH value of composition | Wafer polishing test Time for smooth surface | Rinse polishing time | Silica dispersion test of polishing composition |
|---|---|---|---|---|---|---|---|---|---|
| Example 1 | GGG | 100 *1 | KCl | 0.005 | — | 9.8 | 10 min | 30 sec | 5 cycle |
| 2 | GGG | 100 *1 | KCl | 0.006 | Ethylenediamine | 11.0 | 9 | 30 | 5 |
| 3 | GGG | 100 *1 | KCl | 0.01 | — | 9.7 | 5 | 30 | 5 |
| 4 | GGG | 100 *1 | KCl | 0.05 | — | 9.6 | 3 | 30 | 5 |
| 5 | GGG | 100 *1 | KCl | 0.1 | — | 9.6 | 1 | 30 | 5 |
| 6 | PAAM | 100 | KCl | 0.005 | — | 9.8 | 15 | 30 | 5 |
| 7 | PAAM | 100 | KCl | 0.005 | Ethylenediamine | 11.0 | 13 | 30 | 5 |
| 8 | PAAM | 100 | KCl | 0.01 | — | 9.7 | 10 | 30 | 5 |
| 9 | PAAM | 100 | KCl | 0.05 | — | 9.6 | 5 | 30 | 5 |
| 10 | PAAM | 100 | KCl | 0.1 | — | 9.6 | 3 | 30 | 5 |
| 11 | SPH | 100 | KCl | 0.005 | — | 9.8 | 10 | 30 | 6 |
| 12 | SPH | 100 | KCl | 0.005 | Ethylenediamine | 11.0 | 9 | 30 | 5 |
| 13 | SPH | 100 | KCl | 0.01 | — | 9.7 | 5 | 30 | 5 |
| 14 | SPH | 100 | KCl | 0.05 | — | 9.6 | 3 | 30 | 5 |
| 15 | SPH | 100 | KCl | 0.1 | — | 9.6 | 1 | 30 | 5 |
| Compara- | — | — | — | — | — | 9.8 | over 20 min | — | 5 |

TABLE 1-continued

| Item No. | Water-solube polymeric compound Type | Water-solube polymeric compound Content (ppm) | Water-solube salt Type | Water-solube salt Content (%) | Alkaline substance Type | pH value of composition | Wafer polishing test Time for smooth surface | Wafer polishing test Rinse polishing time | Silica dispersion test of polishing composition |
| --- | --- | --- | --- | --- | --- | --- | --- | --- | --- |
| tive Example 1 | | | | | | | | | |
| 2 | GGG | 100 *1 | — | — | Ammonia | 10.0 | 5 | 1 min | 100 |

Note:
*1 Content converted to guar gum

The following can be seen from Table 1:

1. When a wafer is polished using the inventive polishing composition, in particular, using that containing large amounts of the water-soluble salt, final polishing time is reduced and the polishing composition is suited for use as a polishing agent. Furthermore, silica particles of the slurry have good dispersibility, which makes the polishing composition easy to handle.

2. On the other hand, a polishing composition such as Comparative Example 1 which does not contain a water-soluble polymeric compound cannot achieve final polishing. When silica particles are given in the form of a silica powder as in Comparative Example 2, the polishing composition is suitable for final polishing, but is inferior in dispersibility to the inventive polishing composition and requires continuous stirring during polishing operation.

What is claimed is:

1. A final polishing composition for a wafer comprising water, colloidal silica, a water-soluble polymeric compound and a water-soluble salt;

said colloidal silica comprising 20 to 50% by weight of silica and 80 to 50% of water and having an average silica particle diameter of 5 to 500 mμ and silanol groups on the surface thereof in a surface density of about 8 groups/nm$^2$;

said water-soluble polymeric compound being present in an amount of 20 to 1,000 ppm and being one or more selected from the group consisting of polyethylene oxide, polyacrylamide, polyvinylpyrrolidone, hydroxypropylcellulose, polyacrylic acid, polymethacrylic acid, polymaleic acid, a copolymer of acrylamide and acrylic acid and a graft copolymer of guar gum with acrylamide and having a molecular weight of 100,000 or more and said water-soluble salt being present in an amount of 20 to 1,000 ppm and being one or more combinations of a cation selected from the group consisting of sodium, potassium and ammonium, and an anion selected from the group consisting of fluoride, chloride, nitrate and perchlorate.

2. The final polishing composition for a wafer of claim 1 wherein said water-soluble salt is one or more selected from the group consisting of potassium chloride and ammonium chloride.

3. The final polishing composition for a wafer of claim 1 having a silica concentration of 0.1 to 5% by weight and a concentration of said water-soluble polymeric compound of 1 to 100 ppm.

* * * * *